United States Patent
Dirks et al.

(10) Patent No.: US 7,546,568 B2
(45) Date of Patent: Jun. 9, 2009

(54) AUTOMATION OF TIE CELL INSERTION, OPTIMIZATION AND REPLACEMENT BY SCAN FLIP-FLOPS TO INCREASE FAULT COVERAGE

(75) Inventors: Juergen Dirks, Holzkirchen (DE); Matthias Dinter, Holzkirchen (DE); Ralf Leuchter, Munich (DE)

(73) Assignee: LSI Corporation, Milpitas, CA (US)

( * ) Notice: Subject to any disclaimer, the term of this patent is extended or adjusted under 35 U.S.C. 154(b) by 346 days.

(21) Appl. No.: 11/311,515

(22) Filed: Dec. 19, 2005

(65) Prior Publication Data

US 2007/0143725 A1   Jun. 21, 2007

(51) Int. Cl.
G06F 17/50 (2006.01)
G06F 7/38 (2006.01)

(52) U.S. Cl. ............... 716/12; 716/11; 716/16; 716/18; 326/38

(58) Field of Classification Search ......... 716/7–12, 716/16, 18; 364/491, 489
See application file for complete search history.

(56) References Cited

U.S. PATENT DOCUMENTS

| | | | | |
|---|---|---|---|---|
| 5,157,618 A | * | 10/1992 | Ravindra et al. ............. 716/16 |
| 5,901,065 A | * | 5/1999 | Guruswamy et al. ........... 716/8 |
| 5,920,486 A | * | 7/1999 | Beahm et al. ................. 716/10 |
| 6,006,024 A | * | 12/1999 | Guruswamy et al. .......... 716/12 |
| 6,209,123 B1 | * | 3/2001 | Maziasz et al. ............... 716/14 |
| 6,823,502 B2 | * | 11/2004 | Wingren et al. ................ 716/9 |
| 7,191,424 B2 | * | 3/2007 | Dirks et al. .................... 716/12 |
| 7,271,608 B1 | * | 9/2007 | Vermeire et al. ............. 324/763 |
| 7,290,238 B2 | * | 10/2007 | Stauffer et al. ................ 716/18 |
| 7,328,419 B2 | * | 2/2008 | Vuong et al. .................. 716/11 |
| 7,334,207 B2 | * | 2/2008 | Preuthen et al. .............. 716/10 |
| 2002/0076851 A1 | * | 6/2002 | Eden et al. ................... 438/106 |
| 2008/0263493 A1 | * | 10/2008 | Berry et al. ................... 716/12 |

* cited by examiner

*Primary Examiner*—Helen Rossoshek
(74) *Attorney, Agent, or Firm*—Christopher P. Maiorana, PC

(57) ABSTRACT

A method for designing an integrated circuit is disclosed. The method generally comprises the steps of (A) splitting a design layout of the integrated circuit into a plurality of tiles, (B) adding a plurality of tie-to cells to the design layout, wherein at least one of the tie-to cells generating a tie-to signal at a particular logical level is added into each of the tiles having at least one gate with an input fixed to the particular logical level and (C) routing the tie-to signal to each of the inputs within each of the tiles.

18 Claims, 4 Drawing Sheets

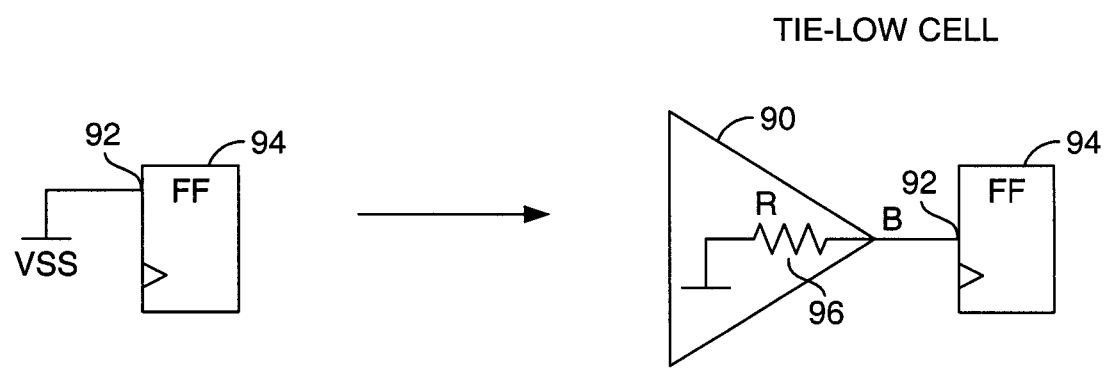
FIG. 1
(CONVENTIONAL)

US 7,546,568 B2

AUTOMATION OF TIE CELL INSERTION, OPTIMIZATION AND REPLACEMENT BY SCAN FLIP-FLOPS TO INCREASE FAULT COVERAGE

FIELD OF THE INVENTION

The present invention relates to integrated circuit designing generally and, more particularly, to an automation of tie cell insertion, optimization and replacement by scan flip-flops to increase fault coverage.

BACKGROUND OF THE INVENTION

Chip designs usually contain gates that have one or more inputs fixed to a logic low level (also called a logical zero level or VSS) or a logic high level (also called a logical one level or VDD). For 90 nanometer and smaller technologies, the fixed inputs cannot be implemented by directly connecting the gate inputs to a power rail or a ground rail. High voltages and currents received from the rails are able to destroy the gates. To protect the gates, additional resistors are connected between the gate inputs and the rails. The resistors are commonly implemented using extra cells connected between the gate inputs and the rails. The newly inserted cells are called "tie-high" cells when connected to a VDD rail, "tie-low" cells when connected to a VSS rail and "tie-to" cells when referred to generically.

Referring to FIG. 1, a block diagram of a conventional tie-low cell 90 is shown. The conventional tie-low cell 90 is used to maintain an input 92 to an example logic gate 94 at the logical low level. The tie-low cell 90 is conventionally implemented as a resistor 96. The resistor 96 may be coupled to a ground rail (i.e., VSS) to generate a signal (i.e., B) at the logical low level. A tie-high cell would generate the signal B at the logical high level.

If the tie-to cells are inserted in a pre-layout netlist, the tie-to cells can cause several problems during cell placement and routing of the design. For example, the tie-to cells can cause the tied gates not to be optimally placed or routed. In particular, some conventional tools are not even allowed to touch such special resistor cells (i.e., the tied-to cells). For the insertion of the tie-to cells after the place-and-route phase of the design, no conventional tool is currently available. Therefore, the tie-to cells are commonly inserted into the design flow by manual netlist changes (i.e., by writing engineering change orders). Manually inserting the tie-to cells later in the flow involves changes to the netlist that are error prone and can lead to non-optimal results

SUMMARY OF THE INVENTION

The present invention concerns a method for designing an integrated circuit. The method generally comprises the steps of (A) splitting a design layout of the integrated circuit into a plurality of tiles, (B) adding a plurality of tie-to cells to the design layout, wherein at least one of the tie-to cells generating a tie-to signal at a particular logical level is added into each of the tiles having at least one gate with an input fixed to the particular logical level and (C) routing the tie-to signal to each of the inputs within each of the tiles.

The objects, features and advantages of the present invention include providing an automation of tie-to cell insertion, optimization and replacement by scan flip-flops to increase fault coverage that may (i) allow insertion of tie-high cells and tie-low cells at an end of a design flow, (ii) permit optimization of cell placement and routing independent of the tie-to cells and/or (iii) increase fault coverage for manufacturing compared with conventional techniques.

BRIEF DESCRIPTION OF THE DRAWINGS

These and other objects, features and advantages of the present invention will be apparent from the following detailed description and the appended claims and drawings in which:

FIG. 1 is a block diagram of a conventional tie-low cell;

DETAILED DESCRIPTION OF THE PREFERRED EMBODIMENTS

The present invention generally describes a flow and a mechanism for automated tie-high cell and tie-low cell insertion and optimization for Application Specific Integrated Circuits (ASICs), Platform ASIC-like designs, Field Programmable Gate Arrays (FPGAs) and/or similar integrated circuits. In order to get optimal results for insertion of the tie-to cells (e.g., tie-high cells and/or tie-low cells), the insertion may be performed after all optimization of a design layout of the integrated circuit has been completed. Optimization generally means synthesis of a gate level netlist as well as physical optimization after cell placement and even after detailed routing should be finished. After the optimization, a tool in accordance with the present invention may be used to insert the tie-to cells in a flexible manner. The tool may provide a good balance between the two extreme corners of (i) placing one tie-to cell for every gate input that is tied to either a logical high level (e.g., power VDD) or a logical low level (e.g., power VSS) and (ii) place just one tie-high cell and one tie-low cell in the design layout and reach all tied-to gate inputs by long routing from the placed tie-to cells to the tied gate inputs.

The balance between the two corner solutions generally avoids major disadvantages of each corner solution. For example, placing as many tie-to cells as are tied gate inputs consumes a lot of space, which most designs do not offer. The tie-to cell space would have to be taken into account upfront and therefore is not an optimal solution for cost effectiveness. On the other hand, just placing a single tie-high cell and a single tie-low cell results in a lot of routing on top of the already existing signal routing. Some designs that are very congested due to routing intense design structures may not be able to fit in much extra routing.

Figure 2:
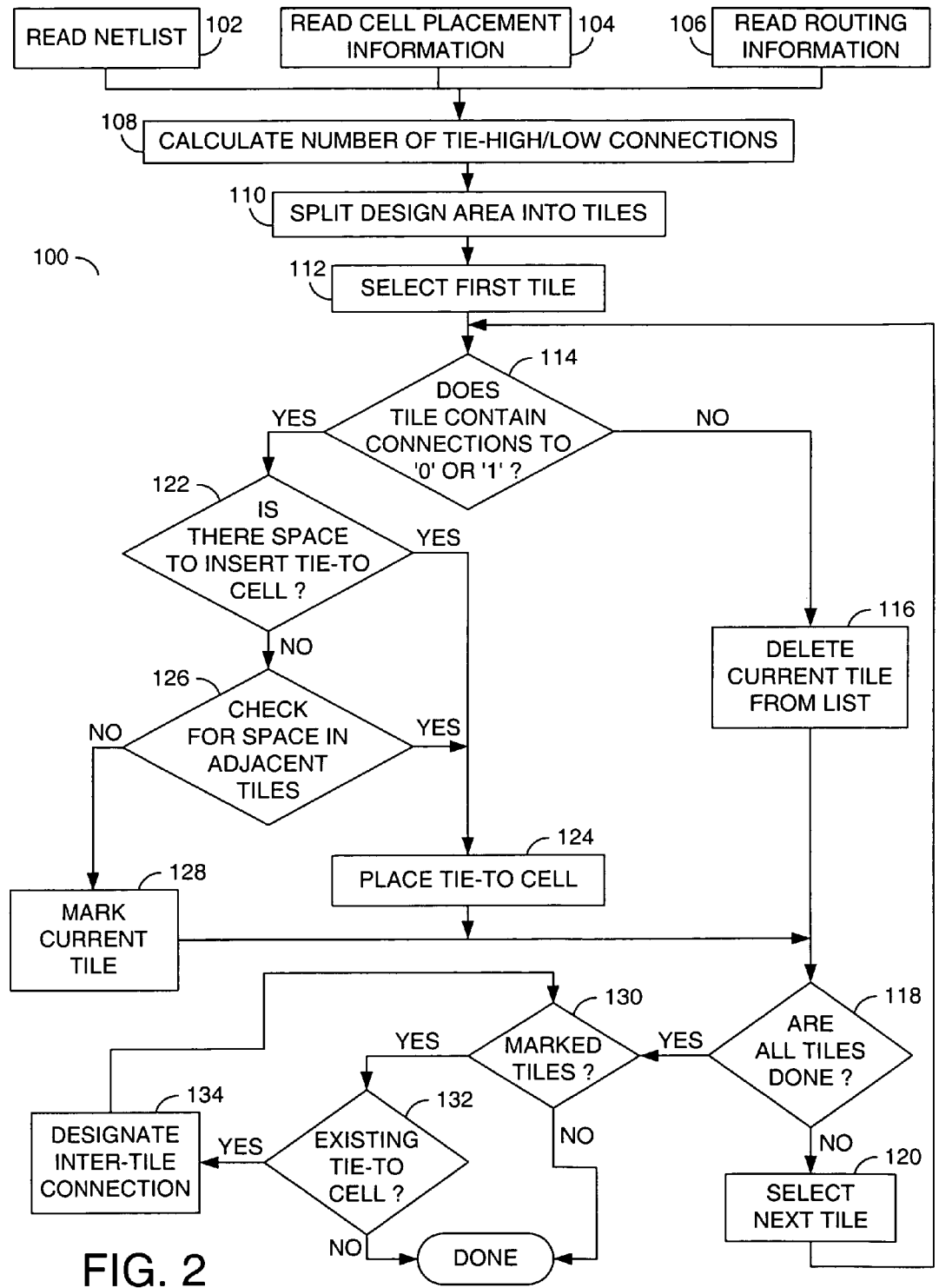
FIG. 2 is a flow diagram of an example method for operating a tie-to cell insertion tool in accordance with a preferred embodiment of the present invention.

Referring to FIG. 2, a flow diagram of an example method 100 for operating a tie-to cell insertion tool is shown in accordance with a preferred embodiment of the present invention. The method (or process) 100 generally comprises a step (or block) 102, a step (or block) 104, a step (or block) 106, a step (or block) 108, a step (or block) 110, a step (or block) 112, a step (or block) 114, a step (or block) 116, a step (or block) 118, a step (or block) 120, a step (or block) 122, a step (or block) 124, a step (or block) 126, a step (or block) 128, a step (or block) 130, a step (or block) 132 and a step (or block) 134. The method 100 generally allows the insertion tool to find a good balance, depending on the design structure, for inserting tie-to cells after placement and routing optimization of functional gates has been completed.

In the steps 102, 104 and 106, cell netlist, cell placement information and cell routing information may be read into the insertion tool. Based on the information, the insertion tool may calculate how many inputs of various gates should be connected to a logical high level (or logical high state) type of signal and/or a logical low level (or logical low state) type of signal in the step 108. The insertion tool may split the physical design layout (e.g., die layout or chip layout) into several tiles in the step 110. A tile is generally a rectangular or square area covering a portion of the layout. Other tile shapes may be implemented to meet the criteria of a particular application. A size of the tiles may be user defined.

In some embodiments, the technology being used for designing the integrated circuit may limit a maximum length of wires that could connect a particular tie-to cell with a tied-to gate input. In turn, the maximum length value may dictate the maximum tile size. An operation of the insertion tool may be to divide the die (or chip) into so many tiles that each tie-to cell placed in any of the tiles may provide a connection to each location inside the tile without violating potential maximum wire length rules.

In the step 112, the insertion tool may select a first tile as a current tile under consideration. The insertion tool generally checks in the step 114 whether any logic gates within the current tile have any inputs that may be fixed in the design to the logical high level and/or the logical low level. If no tied gate inputs exist (e.g., the NO branch of step 114), the current tile may be dropped in the step 116 from a list of tiles to be checked. Another check may be made in the step 118 to see if all of the tiles have been checked. If one or more tiles remain to be checked (e.g., the NO branch of step 118), a next tile is selected in the step 120 as the current tile under consideration. The method 100 may then repeat from the check in step 114 using the new current tile.

If tied-to gate inputs exist in the current tile (e.g., the YES branch of step 114), the insertion tool generally tries to find space within the current tile in the step 122. If sufficient space exists (e.g., the YES branch of step 122), the insertion tool may place the appropriate tie-to cells (e.g., a tie-high cell and/or a tie-low cell) into the current tile in the step 124. Afterwards, the check may be made again in the step 118 to see if all of the tiles have been considered.

If insufficient space is available in the current tile to place all of the appropriate tie-to cells (e.g., the NO branch of the step 122), the insertion tool may check for available space in other tiles adjacent to and/or adjoining the current tile. If space is available in another tile (e.g., the YES branch of step 126), the tie-to cell or cells may be placed in the other tile in the step 124. If no space is reasonably available (e.g., within the maximum wire length) in any neighboring tile (e.g., the NO branch of step 126), the insertion tool may mark the current tile (e.g., mark as "not enough space") in the step 128 and put the current tile on a list to be worked on later. Processing may continue with the check in step 118 for a next available tile.

After going through all of the tiles as described above (e.g., the YES branch of step 118), the insertion tool may check for the tiles marked with "not enough space" in the step 130. If no tiles are marked (e.g., the NO branch of step 130), the method 100 may end. If one or more tiles are marked (e.g., the YES branch of step 130), a check may be made in step 132 of the surrounding tiles for an already-placed tie-to cell of the appropriate type (e.g., same tie-high and/or tie-low suitable for use in the "not enough space" tile). If no nearby tie-to cell is available, (e.g., the NO branch of step 132), solution of the problem may be left to the engineers to solve. If a nearby tie-to cell is available (e.g., the YES branch of step 132), an inter-tile connection may be designated in the step 134 to use the tie-to cell from one tile to drive the gate input in another tile. The method 100 may then check again (e.g., step 130) for other tiles marked as "not enough space".

Figure 3:
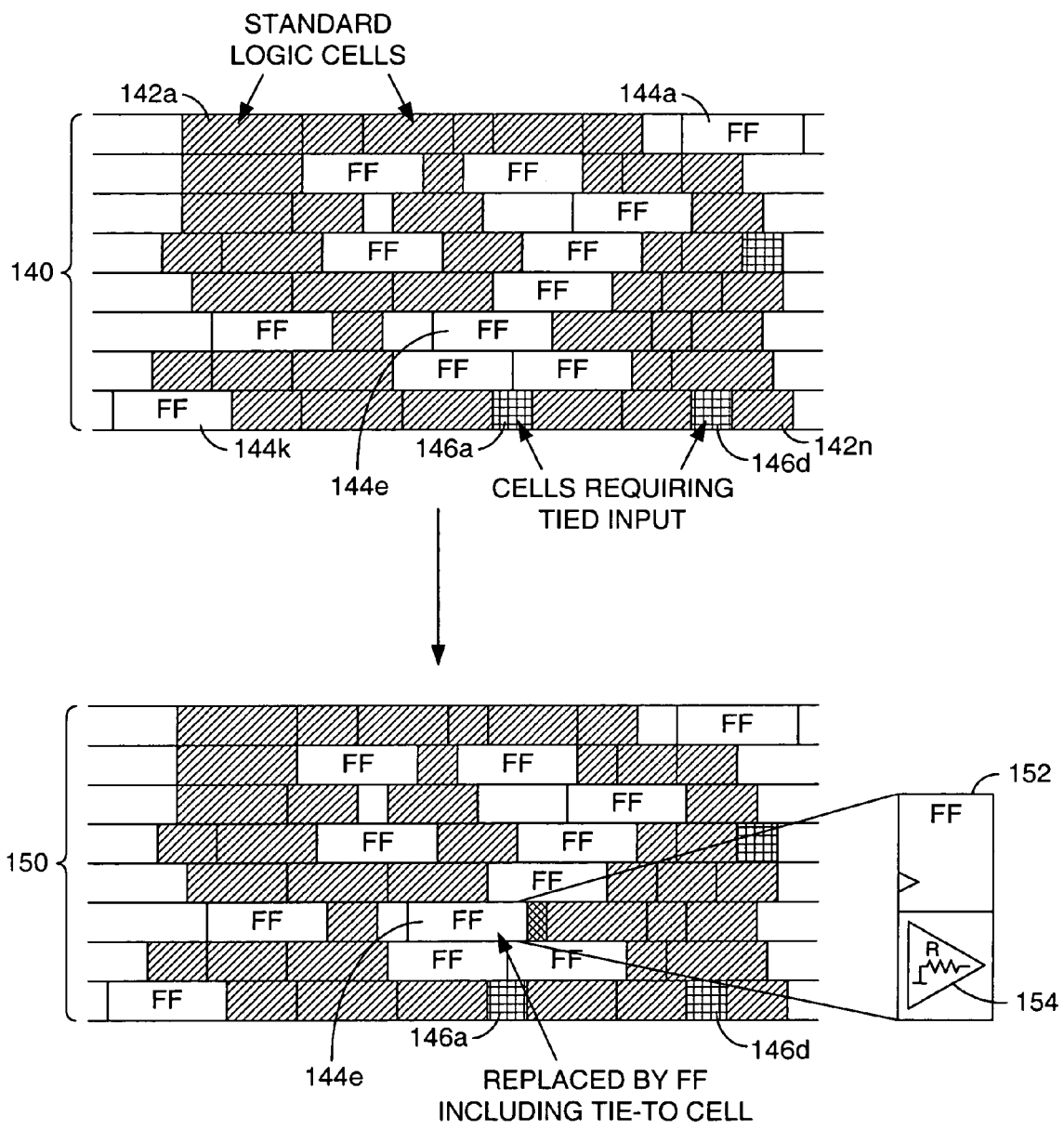
FIG. 3 is a block diagram of an example cell substitution.

Referring to FIG. 3, a block diagram of an example cell substitution is shown. In such an embodiment (as referred to in FIG. 3), tie-to cells may be part of certain standard (or common) logic cells, which are usually spread around quite evenly over the die (e.g., spread may be based on a statistical examination). For example, a technology library used to develop the integrated circuit may include a common flip-flop cell. A special flip-flop cell in the technology library may contain an extra part comprising a tie-high cell or a tie-low cell. Based on a calculation done by the insertion tool similar to the steps described above in FIG. 2, the insertion tool may replace as many standard flip-flop cells with the special flip-flop cells as appropriate in locations where there is sufficient space and a nearby fixed gate inputs to connect with.

As illustrated in FIG. 3, an initial design layout 140 may include multiple standard logic cells 142a-142n and several common flip-flop cells 144a-144k scattered throughout. One or more tied-input logic cells 146a-146d may have gate inputs that should be fixed (or tied) to the logical high level and/or the logical low level per the circuit design.

The insertion tool may insert one or more tie-to cells proximate one or more of the tied-input logic cells 146a-146d, with or without the tiling process in FIG. 2. The tie-to cells may be inserted by replacing one or more of the common cells (e.g., the standard flip-flop cells 144a-144k) with an appropriate type of special cell (e.g., a special flip-flop cell having an embedded tie-to cell). For example, a final design layout 150 may comprise a special flip-flop cell 152 incorporating a tie-low cell 154 in place of a given standard flip-flop cell (e.g., 144e) proximate a given tied-input logic cell (e.g., 146a). As a result the insertion tool may reach an optimal distribution of tie-to cells over the final design layout 150 of the die in locations where the tie-to cells may be useful, use available space and keep the additional routing overhead small enough to be completed. If the insertion tool finds that too much routing overhead may remain in certain spots, the insertion tool may be operational to optimize further by inserting additional tie-to cells, thereby shortening and/or altering the routing wires.

Figure 4:
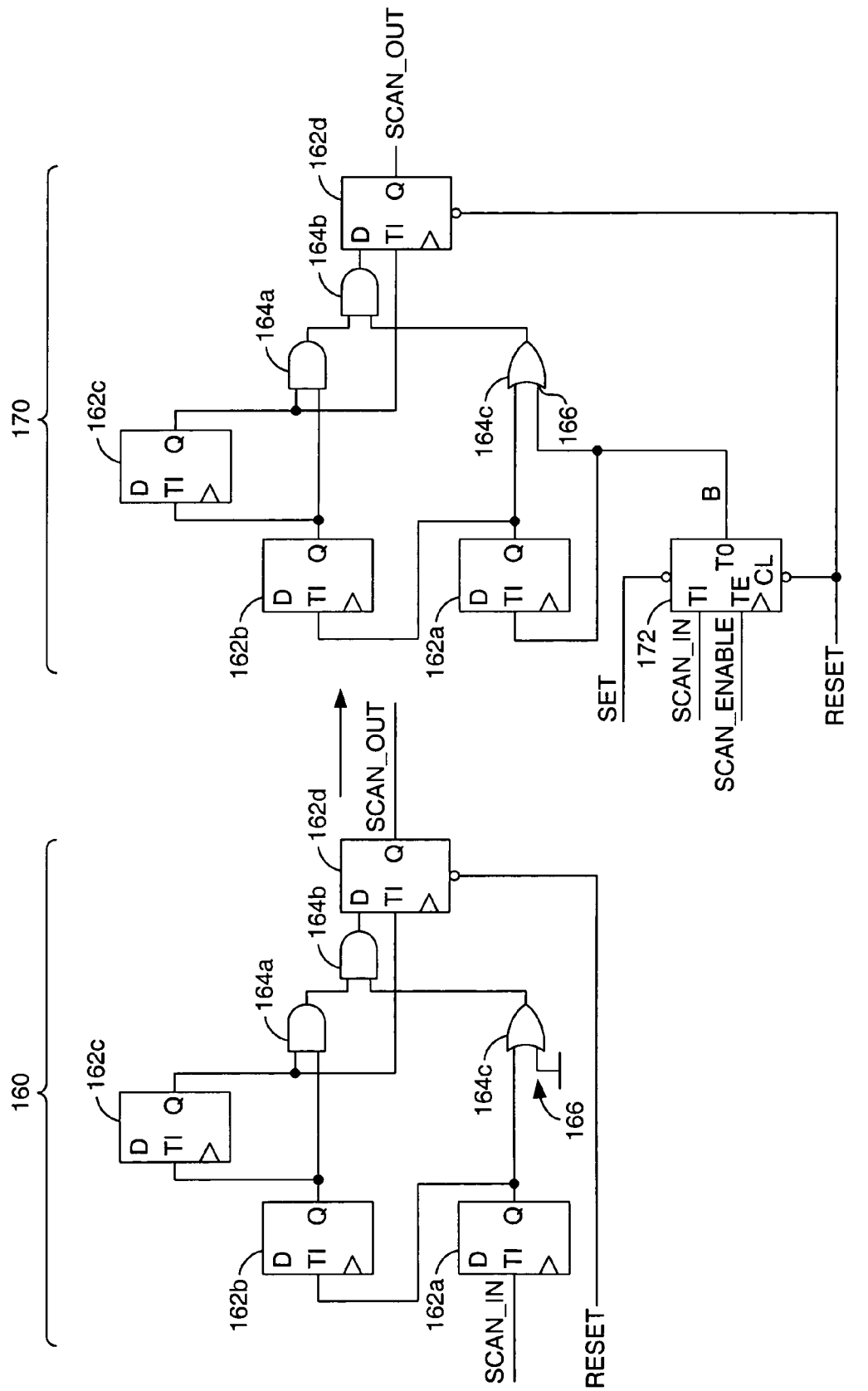
FIG. 4 is a block diagram of an example scan cell insertion.

Referring to FIG. 4, a block diagram of an example scan cell insertion is shown. Tied inputs of gates generally lead to a decreased fault coverage for manufacturing test. Therefore, in some embodiments of the present invention, the tie-high cells and tie-low cells may be replaced by a special type of scan cell. The special scan cells may be a type of flip-flop cell (or multiple flip-flop cells) that do not have a data-input (D) pin. A special scan cell generally comprise (i) a test-input (TI) pin connectable to a scan chain, (ii) a test-output (TO) pin connectable to the scan chain, (iii) a test-enable (TE) pin connectable to a scan enable signal (e.g., SCAN_ENABLE) and (iv) a reset pin and/or a set pin. The presence/absence of a reset pin and a set pin generally depend on whether the scan cell is used as a tie-low cell or a tie-high cell.

As illustrated in FIG. 4, an initial design layout 160 may include multiple scan cells 162a-162d and multiple logic gates 164a-164c. One or more particular logic gates (e.g., an OR logic gate 164c) may have an input 166 fixed to a particular logic level (e.g., the logical low level). The scan cells 162a-162d may form a scan chain from an input signal (e.g., SCAN_IN) to an output signal (e.g., SCAN_OUT). A reset signal (e.g., RESET) may be used to force the output signal SCAN_OUT into a predetermined logic level.

The insertion tool may adjust the initial design layout 160 by inserting one or more special scan cells (e.g., scan cell 172) into the scan chain to form an updated design layout 170. The special scan cell 172 may generate an output signal (e.g., B) connected to the input 166 of the particular logic gate 164c. The signal RESET may also be routed to the special scan cell 172 such that when the signal RESET is asserted (e.g., driven to the logical low level), the special scan cell 172 may drive the output signal B and the input 166 to the logical low level. As such, while the scan chain is operating in a feed-through mode (e.g., passing data in parallel from the D-inputs to Q-outputs), the special scan cell 172 may hold the input 166 at the intended logical low level. While the scan chain is operating in a test mode (e.g., passing test data in series along the scan chain from the TI-inputs to the Q-outputs), the special scan cell 172 may drive the signal B to either the logical high level or the logical low level as controlled by the signal SCAN_IN.

In other embodiments, the special scan cell may be operational to generate the output signal B in response to a set signal. When the set signal is asserted, the special scan cell may drive the output signal B to the logical high level to implement a tie-high operation. As such, the tied inputs of the logic gates generally become controllable for boundary-scan testing and the fault coverage may be increased. The special scan cells may be inserted the same way as tie-to cells described above and may feed one or more tied gate inputs, depending on space and routing resources available in the design at the end of the flow.

Because the insertion may be done toward the end of the design flow, a layout of the die may be optimized to use the available space for cells and routing on the die rather than wasting resources upfront by implementing the tie-to cells without knowledge of the physical constraints. Furthermore, when using the special scan cells instead of direct tie-to connections, the fault coverage for manufacturing may be increased.

The various signals of the present invention are generally "on" (e.g., a digital HIGH, logical high or 1) or "off" (e.g., a digital LOW, logical low or 0). However, the particular polarities of the high levels (e.g., asserted) and low levels (e.g., de-asserted) of the signals may be adjusted (e.g., reversed) to meet the design criteria of a particular implementation. Additionally, inverters may be added to change a particular polarity of the signals.

The function performed by the flow diagram of FIG. 2 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMS, EPROMS, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for designing an integrated circuit, comprising the steps of:
 (A) splitting a design layout of said integrated circuit into a plurality of tiles, wherein (i) said tiles each have a respective boundary, (ii) said design layout comprises a plurality of logic gates and (iii) said logic gates of a given set each have a respective logic input to be fixed at a first logical level;
 (B) generating a list of said tiles;
 (C) deleting from said list each of said tiles that does not contain at least one of said logical gates having at least one tied-to input;
 (D) adding a plurality of tie-to cells to said design layout, wherein (i) said tie-to cells of a first set each generate a respective first tie-to signal at said first logical level, (ii) said first tie-to signals are intentionally current limited by said tie-to cells to prevent gate damage and (iii) said logic inputs of said given set of said logic gates outnumber said tie-to cells of said first set; and
 (E) routing said first tie-to signals from said tie-to cells of said first set to said logic inputs of said given set without crossing said boundaries.

2. The method according to claim 1, wherein said tie-to cells of said first set each comprises a tie-high cell generating said first tie-to signal at a logical high level.

3. The method according to claim 1, wherein said tie-to cells of said first set each comprises a tie-low cell generating said first tie-to signal at a logical low level.

4. The method according to claim 1, wherein (i) said tie-to cells of a second set each generate a respective second tie-to signal at a second logical level, (ii) said second tie-to signals are intentionally current limited by said tie-to cells to prevent gate damage and (iii) said first logical level is different than said second logical level.

5. The method according to claim 1, further comprising the step of:
 routing a second tie-to signal from a particular one of said tie-to cells of a second set to a particular one of said logic gates, wherein (i) said particular tie-to cell is in a first tile of said tiles, (ii) said particular logic gate is in a second tile of said tiles and (iii) said second tile is adjacent said first tile.

6. The method according to claim 1, further comprising the step of:
 routing a second tie-to signal from a particular one of said tie-to cells of said first set of said tie-to cells to a particular one of said logic inputs, wherein said second tie-to signal crosses one of said boundaries.

7. The method according to claim 1, further comprising the step of:
 generating at least one of said first tie-to signals using a resistive path to a power rail.

8. A method for designing an integrated circuit, comprising the steps of:
 (A) splitting a design layout of said integrated circuit into a plurality of tiles, wherein (i) said tiles each have a respective boundary, (ii) said design layout comprises a plurality of logic gates and (iii) said logic gates of a given set each have a respective logic input to be fixed at a first logical level;
 (B) adding a plurality of tie-to cells to said design layout, wherein (i) said tie-to cells of a first set each generate a respective first tie-to signal at said first logical level, (ii) said first tie-to signals are intentionally current limited by said tie-to cells to prevent gate damage and (iii) said logic inputs of said given set of said logic gates outnumber said tie-to cells of said first set;

(C) routing said first tie-to signals from said tie-to cells of said first set to said logic inputs of said given set without crossing said boundaries; and (D) marking each of said tiles that (i) contains at least one of said logical gates having at least one tied-to input and (ii) lacks available space to place corresponding cells of said tie-to cells to fix said tied-to input.

9. The method according to claim 8, further comprising the step of:
checking available space in each of said tiles adjoining said tiles that have been marked to place said corresponding cells.

10. A storage medium for use in a computer to for design an integrated circuit, the storage medium recording a computer program that is readable and executable by the computer, when executed the computer program comprising the steps of:

(A) splitting a design layout of said integrated circuit into a plurality of tiles, wherein (i) said tiles each have a respective boundary, (ii) said design layout comprises a plurality of logic gates and (iii) said logic gates of a given set each have a respective logic input to be fixed at a first logical level;

(B) generating a list of said tiles;

(C) deleting from said list each of said tiles that does not contain at least one of said logical gates having at least one tied-to input;

(D) adding a plurality of tie-to cells to said design layout, wherein (i) said tie-to cells of a first set each generate a respective first tie-to signal at said first logical level, (ii) said first tie-to signals are intentionally current limited by said tie-to cells to prevent gate damage and (iii) logic inputs of said given set of said logic gates outnumber said tie-to cells of said first set; and (E) routing said first tie-to signals from said tie-to cells of said first set to said logic inputs of said given set without crossing said boundaries.

11. The storage medium according to claim 10, wherein said tie-to cells of said first set each comprises a tie-high cell generating said first tie-to signal at a logical high level.

12. The storage medium according to claim 10, wherein said tie-to cells of said first set each comprises a tie-low cell generating said first tie-to signal at a logical low level.

13. The storage medium according to claim 10, wherein (i) said tie-to cells of a second set each generate a respective second tie-to signal at a second logical level, (ii) said second tie-to signals are intentionally current limited by said tie-to cells to prevent gate damage and (iii) said first logical level is different than said second logical level.

14. The storage medium according to claim 10, further comprising the step of:
routing a second tie-to signal from a particular one of said tie-to cells of a second set to a particular one of said logic gates, wherein (i) said particular tie-to cell is in a first tile of said tiles, (ii) said particular logic gate is in a second tile of said tiles and (iii) said second tile is adjacent said first tile.

15. The storage medium according to claim 10, further comprising the step of:
routing a second tie-to signal from a particular one of said tie-to cells of said first set of said tie-to to a particular one of said logic inputs, wherein said second tie-to signal crosses one of said boundaries.

16. The storage medium according to claim 10, further comprising the step of:
generating at least one of said first tie-to signals using a resistive path to a power rail.

17. A storage medium for use in a computer to for design an integrated circuit, the storage medium recording a computer program that is readable and executable by the computer, when executed the computer program comprising the steps of:

(A) splitting a design layout of said integrated circuit into a plurality of tiles, wherein (i) said tiles each have a respective boundary, (ii) said design layout comprises a plurality of logic gates and (iii) said logic gates of a given set each have a respective logic input to be fixed at a first logical level;

(B) adding a plurality of tie-to cells to said design layout, wherein (i) said tie-to cells of a first set each generate a respective first tie-to signal at said first logical level, (ii) said first tie-to signals are intentionally current limited by said tie-to cells to prevent gate damage and (iii) logic inputs of said given set of said logic gates outnumber said tie-to cells of said first set;

(C) routing said first tie-to signals from said tie-to cells of said first set to said logic inputs of said given set without crossing said boundaries; and (D) marking each of said tiles that (i) contains at least one of said logical gates having at least one tied-to input and (ii) lacks available space to place corresponding cells of said tie-to cells to fix said tied-to input.

18. The storage medium according to claim 17, further comprising the step of:
checking available space in each of said tiles adjoining said tiles that have been marked to place said corresponding cells.

* * * * *